United States Patent

Mertol

[11] Patent Number: 5,834,839
[45] Date of Patent: Nov. 10, 1998

[54] PRESERVING CLEARANCE BETWEEN ENCAPSULANT AND PCB FOR CAVITY-DOWN SINGLE-TIER PACKAGE ASSEMBLY

[75] Inventor: Atila Mertol, Cupertino, Calif.

[73] Assignee: LSI Logic Corporation, Milpitas, Calif.

[21] Appl. No.: 861,884

[22] Filed: May 22, 1997

[51] Int. Cl.$^6$ .............................. H01L 23/12; H01L 23/10
[52] U.S. Cl. .......................... 257/704; 257/707; 257/738; 257/778; 257/780; 361/709; 361/719
[58] Field of Search ..................................... 257/712, 697, 257/720, 738, 778, 780, 704, 706, 707; 361/709, 719

[56] References Cited

U.S. PATENT DOCUMENTS

| | | | |
|---|---|---|---|
| 5,045,921 | 9/1991 | Lin et al. ................................. | 357/74 |
| 5,102,829 | 4/1992 | Cohn ....................................... | 257/697 |
| 5,455,456 | 10/1995 | Newman ................................ | 257/738 |
| 5,572,405 | 11/1996 | Wilson et al. .......................... | 257/724 |
| 5,583,378 | 12/1996 | Marrs et al. ............................ | 257/710 |
| 5,616,958 | 4/1997 | Laine et al. ............................. | 257/738 |
| 5,629,835 | 5/1997 | Mahulikar et al. .................... | 361/719 |

*Primary Examiner*—David Ostrowski
*Attorney, Agent, or Firm*—Fitch Even Tabin & Flannery

[57] ABSTRACT

A semiconductor package for preserving clearance between encapsulant and a printed circuit board is provided including a package substrate having an upper surface and a lower surface, wherein the upper surface is attached to a heat spreader and the lower surface is electrically coupled to a printed circuit board by a plurality of high temperature solder balls, the solder balls being formed from a metal such as lead, tin or copper; a semiconductor die, the non-active side of which is coupled to the heat spreader, and which is electrically coupled to the substrate by bond wires joining bond pads on the active side of the semiconductor die to electrical traces formed on the package substrate; an encapsulant covering the semiconductor die and the bond wires such that the encapsulant forms a protrusion from the lower surface of the package substrate; and a lid having a plurality of stand-off legs, each leg being formed at a corner of the lid, disposed over the encapsulant which establishes the height of the protrusion from the lower surface of the package substrate toward the top surface of the printed circuit board.

14 Claims, 1 Drawing Sheet

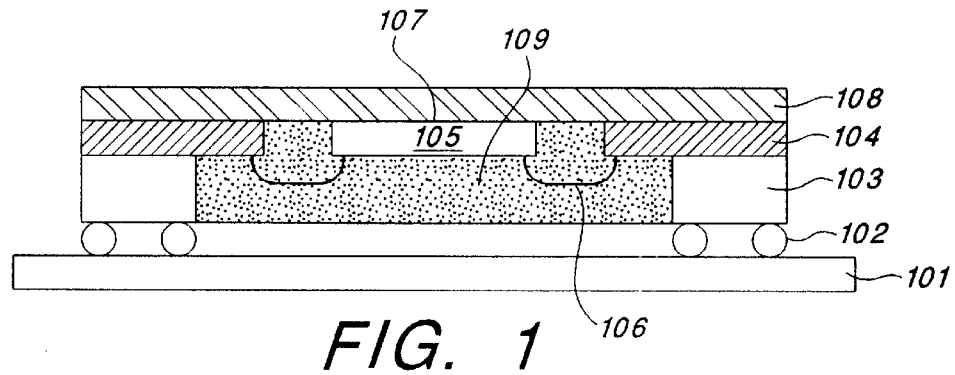
FIG. 1
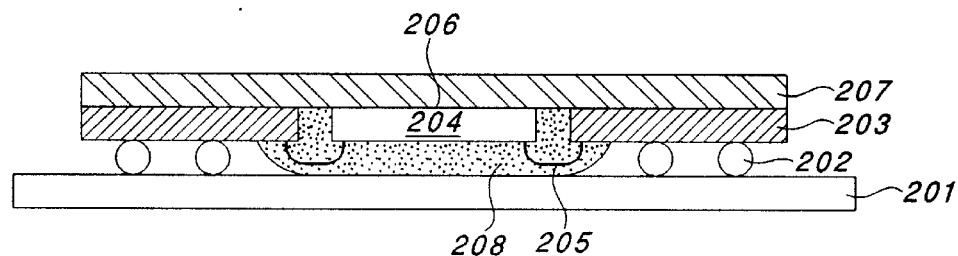
FIG. 2
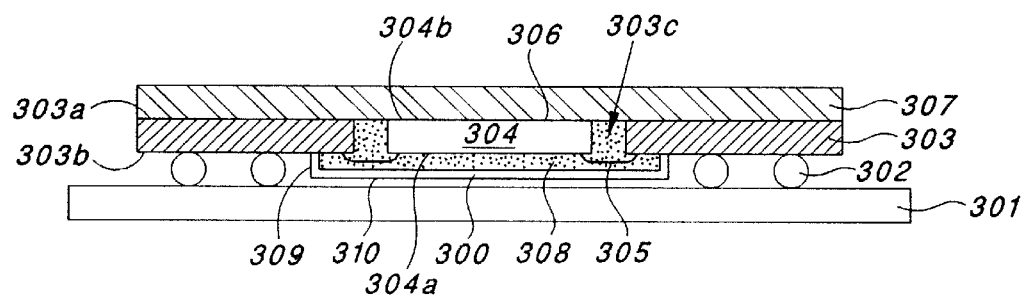
FIG. 3A
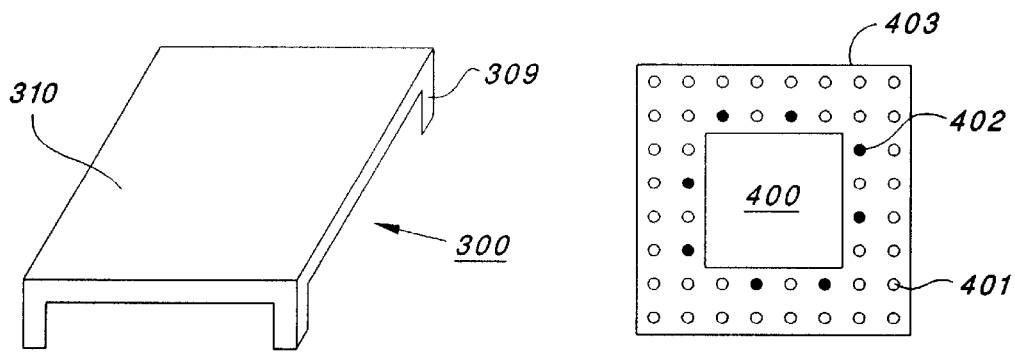
FIG. 3B
FIG. 4

PRESERVING CLEARANCE BETWEEN ENCAPSULANT AND PCB FOR CAVITY-DOWN SINGLE-TIER PACKAGE ASSEMBLY

TECHNICAL FIELD

The present invention relates generally to semiconductor packaging technology, and more particularly, to a package configuration which preserves clearance between encapsulant and a printed circuit board during assembly of cavity-down single-tier semiconductor packages.

BACKGROUND OF THE INVENTION

The amount of heat generated by a semiconductor device, for example, a silicon chip, is related to the number of transistors deployed on the device, the amount of power passed through the transistors, and the clock speed at which the semiconductor device is operated. Thus, as the number of transistors fabricated onto a single semiconductor device increases, the amount of heat generated by the device increases. Likewise, as the amount of power passed through the transistors increases, or as the speed at which the clock operating the semiconductor device increases, the amount of heat generated by the device also increases.

Since advances in semiconductor fabrication technology continue to yield ever more densely packaged high power transistors which are operated at faster and faster clock speeds, the problems associated with semiconductor device heat generation and dissipation are becoming more acute. In performance-driven applications, the highest power options are generally preferred, since they allow the highest clock operating speeds, and thus the difficulties associated with thermal buildup and dissipation are particularly prevalent.

One major problem associated with high power semiconductor devices is that as an increasing amount of heat is generated, the junction temperature of the transistors on the device increases proportionately. Those of skill in the art will appreciate that the failure rate of a semiconductor device is directly related to the junction temperature at which the device is operated. In other words, the greater the junction temperature, the greater the likelihood the device will fail. Accordingly, it is desirable to fabricate semiconductor devices in various package configurations which facilitate thermal dissipation, and thus extend the life and reduce the failure rate of the devices.

In describing how generated heat is removed from a high power semiconductor device, it is convenient to consider the problem in two parts. First, there is a junction-to-case thermal dissipation path, which is often called the internal thermal path. The junction-to-case path typically has a region directly in contact with the die in which heat flows predominantly in a vertical direction, i.e., a direction normal to the active surface of the die, and then a region with a heat spreader in which lateral heat flow dominates. A heat spreader is any thick, thermally conductive plate mounted to a substrate for taking heat from an electrical device. Heat spreaders are typically constructed of copper or aluminum or another metal with low thermal resistance, i.e., higher thermal conductivity. Since the heat spreader diffuses heat laterally, the area through which heat can flow from the die to the ambient environment is effectively increased. There is also a case-to-ambient thermal dissipation path, frequently called the external thermal path. The case-to-ambient path is dominated by a mechanism for transferring heat from the device directly out into the ambient environment. Certain types of semiconductor packages, referred to as "cavity down" packages, improve heat dissipation because they allow direct contact between a heat spreader and the die itself, therefore, internal resistance juction-to-case is reduced.

An example of a conventional multi-tier cavity-down ball grid array semiconductor package is depicted in FIG. 1. In this configuration, a semiconductor package substrate 104 is fixed to a printed circuit board 101. Substrate 104 is provided with an additional substrate tier 103 to form a cavity into which semiconductor die 105 is placed. Electrical connection between the package and a printed circuit board 101 is provided by a plurality of eutectic solder balls 102. Package substrate 104 may be formed from a variety of materials known to those of skill in the art, for example, from molded plastic with multiple shelves bonded together and electrical traces formed either on or through the body of the substrate for connection via bond wires 106 to bond pads on electrically active portions of the semiconductor die 105. When the substrate 104 is formed from a plastic material, the package is often referred to as a plastic ball grid array ("PBGA").

Alternatively, the substrate 104 may comprise a thick-film or cofired ceramic material, again having electrical traces for connection via bond wires 106 to bond pads on electrically active portions of semiconductor die 105. If the substrate is formed of a ceramic material, the package is referred to as a ceramic ball grid array ("CBGA"). Still other package techniques are available such as tape automated bonding ("TAB").

Referring still to FIG. 1, package substrate 104 includes tiers 103 which are fixed to the substrate 104 using, for example, a bonding material such as epoxy. The laminated substrate 104 is, in turn, attached to a heat spreader 108, again using a bonding material. The non-active side of semiconductor die 105 is attached to heat spreader 108 by a die attach material 107. As discussed above, desired electrical connections between substrate 104 and semiconductor die 105 may be achieved by connecting bond wires 106 between electrical traces formed on substrate 104 and bond pads formed on semiconductor die 105. Die 105 and bond wires 106 are then encapsulated in an epoxy or other suitable encapsulant 109 to protect the delicate bond wires 106 from damage.

While the multi-tier package shown in FIG. 1 is useful, it is also expensive to produce and thicker than single-tier packages; therefore, single-tier packages are often preferred. An example of a conventional single-tier cavity-down ball grid array semiconductor package is depicted in FIG. 2. This assembly is less expensive to manufacture than the multi-tier assembly shown in FIG. 1. In this configuration, package substrate 203 is attached to printed circuit board 201, again using a plurality of eutectic solder balls 202. However, only a single tier is provided for the substrate 203. A heat spreader 207 is attached to the upper surface of substrate 203. Similar to the multi-tier assembly described above, a semiconductor die 204 is mounted by a die attach material 206 to the heat spreader 207. Bond pads formed on semiconductor die 204 and electrical traces on package substrate 203 are connected by bond wires 205 as desired. An encapsulant 208 is then dispensed over die 204 and bond wires 205.

One advantage of the multi-tier cavity-down configuration over the simpler and less expensive single-tier assembly is that since there is more than one bonding tier, a cavity which may be enclosed is formed on the underside of the package, and thus it is easier to encapsulate the die and bond wires without extending the encapsulant height beyond the package bottom surface, i.e., the surface facing the printed circuit board, as shown in FIG. 1. On the other hand, no cavity is formed in a single-tier assembly, and since the wire bonds have to be cleared, i.e., fully covered, during the encapsulation process, the encapsulant height extends beyond the bottom of the package surface. Moreover, the height of the encapsulant 208 is difficult to precisely control. Thus, while single-tier packages are smaller in size and less expensive to fabricate, wide post-fabrication variations in the thickness of the encapsulant are common.

One difficulty created by the variations in the encapsulant is that, with the single-tier configuration, when the package is mounted onto the circuit board 201 and the eutectic solder balls 202 collapse, the encapsulant 208 may inadvertently touch the circuit board 201, as shown in FIG. 2. After the package is mounted to the circuit board 201, it is difficult to clean the residual solder flux from the portion of the board trapped beneath the encapsulant. Also, contact between the encapsulant 208 and the circuit board 201 causes poor electrical connection between the package and the board because some of the solder balls 202 may not be able to collapse as fully as required.

Accordingly, it is an object of the present invention to provide a semiconductor package which preserves clearance between encapsulant and a printed circuit board in cavity-down single-tier assemblies that overcomes the above-described difficulties. Still further objects and advantages of the present invention will become apparent in view of the following disclosure.

SUMMARY OF THE INVENTION

In one embodiment of the present invention, a semiconductor package which preserves clearance between encapsulant and a printed circuit board in cavity-down single-tier package assemblies is provided including a package substrate having an upper surface and a lower surface, wherein the lower surface is attachable to a printed circuit board; a semiconductor die electrically coupled to the substrate; an encapsulant covering the semiconductor die such that the encapsulant forms a protrusion from the lower surface of the package substrate; and a lid disposed over the encapsulant which limits the height of the protrusion from the lower surface of the package substrate.

In another embodiment of the invention, a semiconductor package which preserves clearance between encapsulant and a printed circuit board in cavity-down single-tier package assemblies is provided including a package substrate having an upper surface and a lower surface, wherein the upper surface is attached to a heat spreader and the lower surface is electrically coupled to a printed circuit board by a plurality of high temperature solder balls, the solder balls being formed from a metal such as high lead, tin or copper; a semiconductor die, the nonactive side of which is coupled to the heat spreader, and which is electrically coupled to the substrate by bond wires joining bond pads on the active side of the semiconductor die to electrical traces formed on the package substrate; an encapsulant covering the semiconductor die and the bond wires such that the encapsulant forms a protrusion from the lower surface of the package substrate; and a lid having a plurality of stand-off legs, each leg being formed at a corner of the lid, disposed over the encapsulant which limits the height of the protrusion from the lower surface of the package substrate toward the top surface of the printed circuit board.

BRIEF DESCRIPTION OF THE DRAWINGS

FIG. 1 is a cross-sectional view of a cavity-down multi-tier semiconductor package mounted to a printed circuit board.

FIG. 2 is a cross-sectional view of a cavity-down single-tier package mounted on a printed circuit board.

FIG. 3a is a cross-sectional view of a semiconductor package having a lid with stand-off pins attached to the encapsulant assembled according to an embodiment of the present invention.

FIG. 3b depicts a lid with stand-off pins for preserving clearance between encapsulant epoxy and a printed circuit board assembled according to an embodiment of the present invention.

FIG. 4 is a bottom view of a cavity-down single-tier package assembly having high temperature solder balls used in conjunction with an encapsulant lid according to an embodiment of the present invention.

DETAILED DESCRIPTION OF EMBODIMENTS OF THE INVENTION

FIG. 3b shows a detailed embodiment of an encapsulant lid 300 according to an embodiment of the present invention. In this embodiment, encapsulant lid 300 has stand-off pins 309 for attachment to package substrate 303. In one embodiment, the stand-off pins 309 are symmetrically chamfered to right-angled corner edges before placement over the encapsulant. Those of skill in the art will recognize that numerous variations of the stand-offs are possible so long as they operate to establish a distance between the bottom surface of the lid 310 and the upper surface of the substrate 301.

In another embodiment of the invention, the lid is made of a metal, such as copper or aluminum, for providing both tensile strength and permitting rapid thermal transfer of heat from the encapsulant into the ambient environment. In other embodiments, the lid may be fashioned from a ceramic, or another material having a low thermal resistance which will also quickly dissipate generated heat and protect delicate bond wiring.

Referring now to FIG. 3a, there is depicted an assembled package having a lid 300 for preserving clearance between encapsulant 308 and a printed circuit board 301 after the encapsulated high power device has been attached according to an embodiment of the present invention.

The topmost portions of package substrate 303 are bonded or otherwise attached to a heat spreader 307. In one embodiment, the heat spreader 307 is made of copper. In another embodiment, heat spreader 307 is made of aluminum or another material with low thermal resistance for facilitating rapid dissipation of generated heat such as a high thermal conductivity plastic.

A semiconductor die 304 is fixed to the heat spreader 307 using a die attach material 306. In certain embodiments, an epoxy or a silver-filled epoxy is used as the die attach. In another embodiment, die 304 is attached to heat spreader 307 using solder as a die attach. Electrical traces on substrate 303 and bond pads on semiconductor die 304 are then electrically connected by bond wires 305.

During fabrication, an encapsulant 308 made of epoxy or the like is dispensed over the die 304 and the bond wires 305, forming a packet of protective material around the semiconductor die and bond wires. An encapsulant lid 300 is then placed over the encapsulant and the encapsulant is cured. This effectively limits the distance that the excess encapsulant can extend beyond the surface of the package substrate 303. Since this distance can be accurately controlled by the dimensions of lid 300, the distance between the circuit board and the lower surface of the lid 300 can now be controlled so that there is no contact between either the lid 300 or the encapsulant 308 and printed circuit board 301 after the package is attached and the solder balls 302 are collapsed.

The semiconductor package, once assembled, is mounted onto printed circuit board 301 by adhering portions of the package substrate 303 to the circuit board 301 using a plurality of eutectic solder balls 302.

It is desirable that the attachment pins of lid 300 have the required stand-off height to extend far enough down toward the circuit board to clear all bonding wires 305 connecting the die 304 and substrate tier 303. Moreover, it is also desirable that the pin height allows sufficient clearance between the lid surface 310 and the upper surface of circuit board 301 to permit removal of the residual solder flux from the board after attachment of the package. In this manner, the height of the encapsulant is established by the stand-offs 309, and greater uniformity between a number of fabricated devices is achieved.

Referring now to FIG. 4, a still further embodiment of the invention is depicted where, in addition to the eutectic solder balls 401 used for mounting the bottom surface of package substrate 403 to the circuit board (not shown), there is also provided a number of stand-off members, for example, high temperature solder balls 402, used on the inner periphery of the package substrate 403 around encapsulant lid 400. Since high temperature solder balls will not fully collapse during the attachment process, the package clearance is further preserved due to the members' stand-off function.

In one embodiment of the invention, the high temperature solder balls are formed from a solder having a high lead content. In other embodiments, small balls comprising tin or copper are substituted for the high temperature solder balls. In still further embodiments, a combination of these materials may be used as long as the resulting ball has sufficient mechanical strength to resist deformation and act as a stand-off during attachment of the package to the printed circuit board.

It will occur to those of skill in the art that further embodiments and advantages may be realized without departing from the scope or spirit of the present invention, and the embodiments recited above should not be considered as limitative.

I claim:

1. A single-tier semiconductor package comprising:
   a single-tier package substrate with an opening in the center having an upper surface and a lower surface, the lower surface having electrical contacts attachable to corresponding electrical contacts on a printed circuit board and the upper surface being attached to a heat spreader, the heat spreader covering one side of the opening to form a cavity;
   a semiconductor die attached to the heat spreader inside the cavity and electrically coupled to the electrical contacts on the lower surface of the substrate;
   an encapsulant covering the semiconductor die within the cavity such that the encapsulant forms a protrusion from the lower surface of the package substrate; and
   a lid disposed over the encapsulant which establishes the height of the protrusion from the lower surface of the package substrate.

2. The single-tier semiconductor package as in claim 1, wherein the semiconductor die is electrically coupled to the substrate by bond wires joining bond pads on the semiconductor die to electrical traces formed on the package substrate.

3. The single-tier semiconductor package as in claim 1 wherein the lid includes at least one stand-off which extends from a surface of the lid to the lower surface of the package substrate to establish the height of the protrusion.

4. The single-tier semiconductor package as in claim 1 wherein the lid includes a plurality of stand-off legs, each leg of the plurality being formed at a corner of the lid, whereby the length of the legs establishes the height of the protrusion between the lid and the lower surface of the package substrate.

5. The single-tier semiconductor package as in claim 1 wherein the lid limits the height of the protrusion formed by the encapsulant such that when the package is mounted to the printed circuit board, a controlled clearance between a bottom surface of the lid and the upper surface of the printed circuit board is preserved such that there is no contact between the two.

6. The single-tier semiconductor package as in claim 1 wherein the lower surface of the package substrate further comprises:
   a plurality of solder balls for providing electrical coupling between the package substrate and the printed circuit board; and
   at least one stand-off member for establishing the distance between a bottom surface of the lid and the upper surface of the printed circuit board when the single-tier semiconductor die is mounted to the printed circuit board.

7. The single-tier semiconductor package as in claim 6 wherein the at least one stand-off member comprises a solder ball having a higher lead content than the solder balls in the plurality of solder balls such that the higher lead content solder ball will not fully collapse during the attachment of the single-tier semiconductor package to the printed circuit board, thereby controlling the distance between the lower surface of the lid and the upper surface of the printed circuit board.

8. The single-tier semiconductor package as in claim 6 wherein the at least one stand-off member comprises a ball formed of a material including tin such that the tin ball will not fully collapse during the attachment of the single-tier semiconductor package to the printed circuit board, thereby controlling the distance between the lower surface of the lid and the upper surface of the printed circuit board.

9. The single-tier semiconductor package as in claim 6 wherein the at least one stand-off member comprises a ball formed of a material including copper such that the copper ball will not fully collapse during the attachment of the single-tier semiconductor package to the printed circuit boards thereby controlling the distance between the lower surface of the lid and the upper surface of the printed circuit board.

10. A single-tier semiconductor package comprising:
    a package substrate having an upper surface and a lower surface with an opening in the center, wherein the upper surface of the package substrate is attached to a heat spreader, the opening forming a cavity therein and wherein the lower surface of the package substrate is electrically coupled to a printed circuit board by a plurality of high temperature solder balls, the solder balls being formed from a metal selected from the group consisting of lead, tin and copper;
    a semiconductor die sized to fit in the cavity of the package substrate, a non-active side of the die being attached to the heat spreader, and an active side of the semiconductor die being electrically coupled to the substrate by bond wires joining bond pads on the semiconductor die to electrical traces formed on the package substrate;

an encapsulant covering the semiconductor die and the bond wires such that the encapsulant forms a protrusion from the lower surface of the package substrate; and a lid having a plurality of stand-off legs, each leg being formed at a corner of the lid, disposed over the encapsulant which establishes the height of the protrusion from the lower surface of the package substrate and a surface of the lid.

11. A cavity-down single-tier semiconductor package assembly comprising:

a package substrate having an upper surface and a lower surface with a cavity in the center, wherein the upper surface is attached to a lower surface of a heat spreader, the lower surface of the package substrate being electrically coupled to a printed circuit board by a plurality of solder balls;

a semiconductor die having an active side and a non-active side and being sized to fit in the cavity, the non-active side of the die being attached to the heat spreader, and the active side of the semiconductor die being electrically coupled to the package substrate by bond wires joining bond pads on the active side of the semiconductor die to electrical traces formed on the package substrate;

an encapsulant covering the semiconductor die and the bond wires such that the encapsulant forms a protrusion from the lower surface of the package substrate; and at least one stand-off member for establishing the distance between the encapsulant and the upper surface of the printed circuit board when the cavity-down single-tier semiconductor die is mounted to the printed circuit board.

12. The cavity-down single-tier semiconductor assembly as in claim 11 further comprising a plurality of stand-off members and wherein at least one of the stand-off member comprises a solder ball having a higher lead content than the solder balls in the plurality such that the higher lead content solder ball will not fully collapse during the attachment of the semiconductor package to the printed circuit board, thereby controlling the distance between the encapsulant and the upper surface of the printed circuit board.

13. The cavity-down single-tier semiconductor assembly as in claim 11 wherein at least one of the plurality of stand-off members comprises a ball formed of tin such that the tin ball will not fully collapse during the attachment of the single-tier semiconductor package to the printed circuit board, thereby controlling the distance between the encapsulant and the upper surface of the printed circuit board.

14. The cavity-down single-tier semiconductor assembly as in claim 11 wherein at least one of the plurality of stand-off members comprises a ball formed of copper such that the copper ball will not fully collapse during the attachment of the single-tier semiconductor package and the printed circuit board, thereby controlling the distance between the encapsulant and the upper surface of the printed circuit board.

* * * * *